(12) United States Patent
Sevlian et al.

(10) Patent No.: US 10,175,268 B2
(45) Date of Patent: Jan. 8, 2019

(54) ACTIVELY CALIBRATED CAPACITIVELY COUPLED ELECTROSTATIC DEVICE FOR HIGH VOLTAGE MEASUREMENT

(71) Applicant: The Board of Trustees of the Leland Stanford Junior University, Palo Alto, CA (US)

(72) Inventors: Raffi Sevlian, Rosemead, CA (US); Ram Rajagopal, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 291 days.

(21) Appl. No.: 15/098,919

(22) Filed: Apr. 14, 2016

(65) Prior Publication Data
US 2016/0305987 A1    Oct. 20, 2016

Related U.S. Application Data

(60) Provisional application No. 62/148,986, filed on Apr. 17, 2015.

(51) Int. Cl.
*G01R 15/16*     (2006.01)
*G01R 35/00*     (2006.01)
*G01R 19/25*     (2006.01)

(52) U.S. Cl.
CPC .......... *G01R 15/16* (2013.01); *G01R 35/005* (2013.01); *G01R 19/2513* (2013.01)

(58) Field of Classification Search
CPC .............................. G01R 15/16; G01R 35/005
See application file for complete search history.

(56) References Cited

U.S. PATENT DOCUMENTS

2013/0221753 A1* 8/2013 Perreault ................. G05F 1/571
                                                                    307/77
2016/0069937 A1* 3/2016 Johnson ................. G01R 15/16
                                                                    324/126

* cited by examiner

*Primary Examiner* — Marc Armand
(74) *Attorney, Agent, or Firm* — Lumen Patent Firm

(57) ABSTRACT

A method of estimating a line voltage is provided that includes configuring a capacitive probe to a power line, injecting a perturbation voltage onto the capacitive probe, where the perturbation voltage has a different frequency than a frequency of the line voltage, measuring, using a capacitive sensor, a retrieved perturbation voltage, where the retrieved perturbation voltage is dependent on a capacitance between the capacitive probe and a ground capacitance, using an appropriately programmed computer to track real time changes in the capacitance of the capacitive probe, and estimating a line voltage.

4 Claims, 7 Drawing Sheets

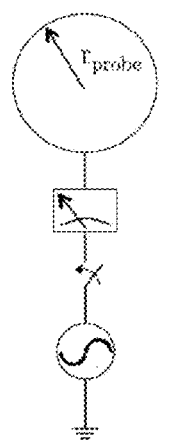
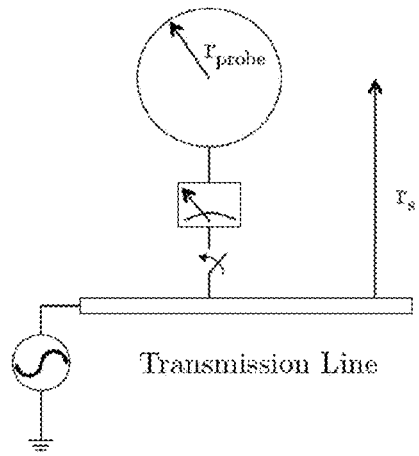
FIG. 1A  FIG. 1B
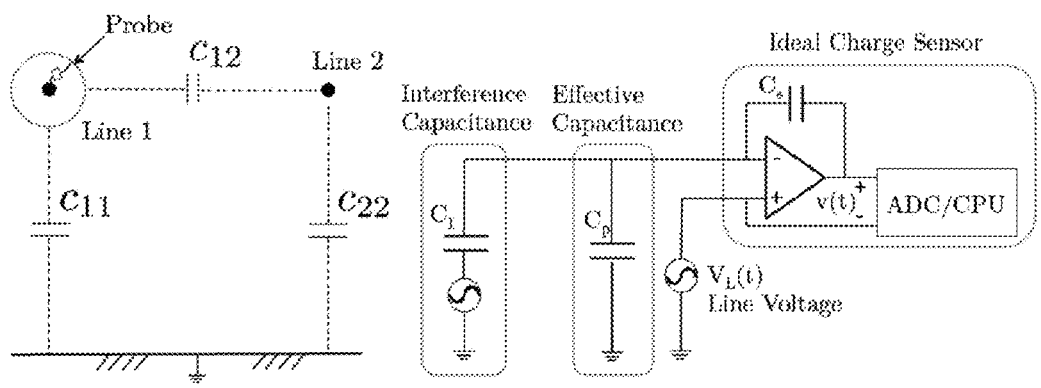
FIG. 2A  FIG. 2B

ACTIVELY CALIBRATED CAPACITIVELY COUPLED ELECTROSTATIC DEVICE FOR HIGH VOLTAGE MEASUREMENT

CROSS-REFERENCE TO RELATED APPLICATIONS

This application claims priority from U.S. Provisional Patent Application 62/148,986 filed Apr. 17, 2015, which is incorporated herein by reference.

FIELD OF THE INVENTION

The invention generally relates to voltage measurement. More specifically, the invention relates to a method of real-time capacitive power line voltage sensing.

BACKGROUND OF THE INVENTION

Modern smart grid infrastructure envisions extensive deployment of renewable generation, PHEV and controllable loads, conservation voltage control and other technologies. To enable these deployments, there is a need for increased sensing and enhanced situational awareness for which Phasor Measurement Units are integral. With the growing deployment of Phasor Measurement Units (PMU's) in the substation level, there is increasing research interest in distribution level PMU development, but also interest lowering the cost of high voltage PMU deployments.

PMU's include voltage and current transducers giving a time-stamped measurement of the respective waveforms from which the magnitude and phase of each waveform can be extracted. Measurements can be taken at the substation as well as the line level. Currently, only about 2000 voltage PMU's are deployed in the US mostly at high voltage substations. The typical cost of PMU installation per circuit is 100 K USD where 90-95% of the cost is due to construction cost. New installations will be much more costly since the sensor technology requires not just a substation upgrade, but a full substation installation of voltage transducers and PMU enabling hardware. Additionally, no technology currently exists to monitor voltage and current phasors along high and medium voltage transmission lines, without building a full substation monitoring station.

The main reason for these limitations is the fundamental sensing methods required for high accuracy sensing, which rely on substation installed CCVT technology to step down the voltage and monitor it accurately. An alternative technology is that of line mounted voltage and current transducers which can contain the transducer, signal processing, PMU functionality and wireless communication as a full turnkey solution.

The primary technology used for non-standard voltage transducers have typically been (1) electrostatic field and (2) capacitively coupled measurements. However, these methods do not reach the required accuracy of the PMU standard.

There has been some attention paid to line mounted capacitively coupled voltage transducers for high voltage applications. Previously work has introduced 'body capacitive voltage measurement', however a calibrated capacitor divider circuit is required for determining the voltage on the line. The device is a doughnut shaped conductive material with an identical charge amplifier circuit. In another attempt, a 'body capacitive' probe having a fixed size sphere, which hangs on the power line is introduced. They present the sensing circuitry to measure the accumulated charge on the device as well. Like other works, the calibration of the probe capacitance is done offline. Recent work published develops a capacitively coupled transducer, where a similar understanding of the capacitive coupling and propose methods to track or mitigate changes in probe capacitance are presented. Here, multiple conductors are used to mitigate the effect of nearby conductors. The results show a nominal voltage magnitude error of 1-12% with 1-5 minute averaging periods. In a further attempt, an algorithm is proposed to mitigate the nearby conductors and determine the height of the device from ground. A parametric model relating the unknown height of the device from ground is used along with long time captures to estimate the height of the device and the probe capacitance. Finally, the estimate of the probe capacitance is used to estimate the line voltage.

What is needed is method of actively calibrated line mounted capitative voltage transducers for low cost high and medium voltage applications.

SUMMARY OF THE INVENTION

To address the needs in the art, a method of estimating a line voltage is provided that includes configuring a capacitive probe to a power line, injecting a perturbation voltage onto the capacitive probe, where the perturbation voltage has a different frequency than a frequency of the line voltage, measuring, using a capacitive sensor, a retrieved perturbation voltage, where the retrieved perturbation voltage is dependent on a capacitance between the capacitive probe and a ground capacitance, using an appropriately programmed computer to track real time changes in the capacitance of the capacitive probe, and estimating a line voltage.

In one aspect of the invention, the capacitive probe includes a conductive cylinder disposed about the power line.

In another aspect of the invention, the capacitive sensor includes a charge measuring circuit and a digital signal processor. In one aspect, the digital signal processor is configured to filter sampled data using a low pass filter for providing a line voltage phasor estimation, where the digital signal processor is configured to filter the perturbation signal using a band pass filter, where the perturbation signal is used to estimate the probe capacitance, where the perturbation signal is used to invalidate unwanted data output resulting from environmental changes.

BRIEF DESCRIPTION OF THE DRAWINGS

FIGS. 1A-1B show (1A) ideal LMCVT consisting of a body capacitive probe connected to an ideal charge sensor connected to AC voltage source, (1B) ideal LMCVT with proximity to nearby conductor, according to one embodiment of the invention.

FIGS. 2A-2B show (2A) body capacitive probe as a multi conductor system. In a distribution system, the distance between conductors is small enough whereby $C_{11}+C_{12}$ is an order of magnitude larger than C12. (2B) Circuit diagram of passive LMCVT device with practical charge sensing capability, probe capacitance $C_p$ and interference capacitance $C_I$, according to one embodiment of the invention.

DETAILED DESCRIPTION

Figure 3:
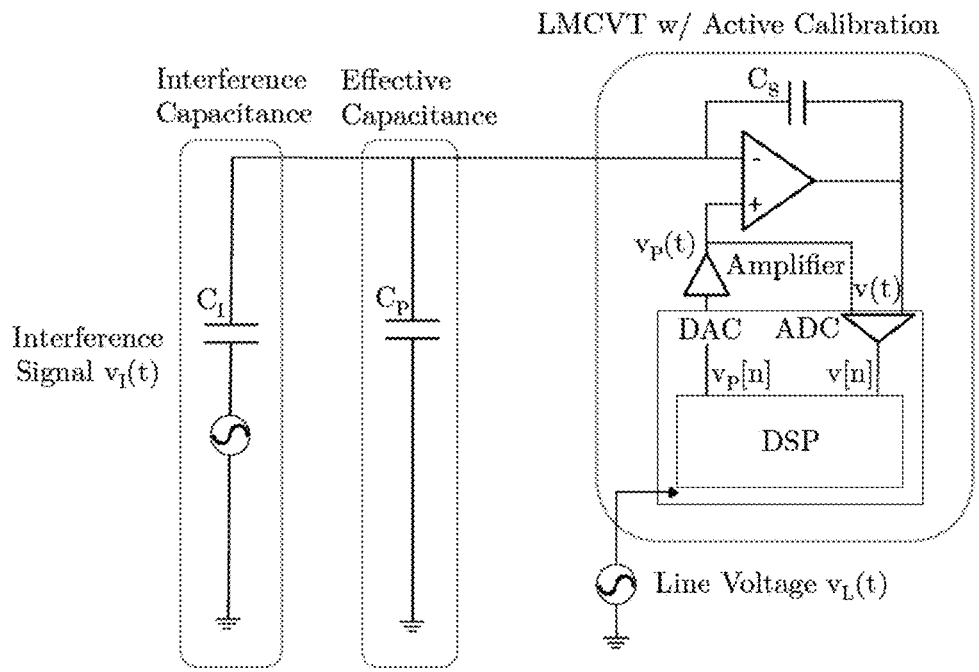
FIG. 3 shows an equivalent circuit diagram representing basic voltage measurement. The body capacitor is shown as a shunt capacitance $C_p$ to ground. The interference source is capacitively coupled with value $C_I$. The charge sensing device is built by a feedback amplifier with impedance Cs, according to one embodiment of the invention.

Actively Calibrated Line Mounted Capacitive Voltage Transducers (LMCVT) are a viable line mountable instrumentation option for deploying large numbers of Phasor Measurement Units onto the medium and high voltage systems. The current invention includes Active Calibration that reduces the error of non-traditional voltage measurements by an order of magnitude from previous work leading to potential line mountable PMU's for high voltage transmission and distribution lines.

For electrostatic field measurement, the electric field generated by an energized power line is measured inside the device at one or many points at varying distances from the line. The measured field is then used to reconstruct the line voltage based on a fixed mapping between the measured field and line voltage. The fundamental limitation for line mounted electrostatic sensors is the dependence on the physical arrangement of the conductor and the ground, which dictates the observed electric field. This can change over time, but must be calibrated before sensor deployment typically in a laboratory setting. When the physical environment changes over time, the inferred voltage level will deviate from the true value.

For capacitive voltage measurements, the term enumerates a number of different configurations of traditional and non-traditional voltage measurements:

1. Line/Ground Mounted devices are electrically connected both to ground and the line. This method covers Capacitively Coupled Voltage Transformers (CCVT), which are only installed at substations.

2. Ground Mounted devices are connected to ground and capacitively coupled to the energized line. This method is more often associated with "Capacitively Coupled" measurement and is considered non-contact since electrical connection is not needed to the energized line. The method has found uses in non-contact voltage instrumentation. However, issues with multiple interfering power lines and large distance between the ground and the conductors have limited the accuracy. Some applications have been capable of inferring the power line phase arrangements.

3. Line Mounted devices are connected to the energized line and capacitively coupled to earth ground. The current invention includes this method, since it is the only method that is line-mountable, easy to deploy but also allows for the active calibration method of the current invention. This method requires electrical connection to the energized line, but does not require grounded connection.

Presented here are the classes of LMCVT technology:

1. Offline Calibration estimates the voltage magnitude from a fixed mapping function, which is determined beforehand in laboratory testing. All electrostatic sensor based methods will fall into this category as well, since they rely on previously computed mapping function.

2. Online Passive Calibration tracks specific changes such as the height of the device or proximity to conductors by processing multiple passive sources. The changes are tracked in an online manner so that the mapping function changes over time, however the task is performed by processing passive measurements. The commonality in both methods is that passive calibration requires (1) long captures (2) parametric models of disturbances and probe-to-ground capacitance.

3. Online Active Calibration, according to the current invention, which uses active voltage injection onto the capacitive probe and then recovers the perturbed value (depending on the probe to ground capacitance). Careful signal design and signal processing technique then allow us to track in real time changes to the probe capacitance and estimate the line voltage.

The current invention provides method of actively calibrated line mounted capitative voltage transducers for low cost high and medium voltage applications. Unlike passive techniques, the invention does not require parametric models, and the capacitance is computed directly via a pilot signaling mechanism, also referred to as a perturbation signal. Active calibration leads to a tremendous improvement in the estimation time and accuracy of the probe to ground capacitance. The invention enables line mountable PMU's for medium to high transmission voltage applications, which can lead to widespread deployment of the technology.

Turning now to the physical model of the line mounted capacitive voltage transducers, models of various properties of a body capacitive probe through the first principles of the devices physical operation are presented. First, discuss are the charge accumulation of an ideal sphere held at the high voltage, leading to the floating capacitor idea. Then introduce is a charging power line to show the effective capacitance of the system as well as interference effects on nearby conductors.

An ideal body capacitive probe is shown in in FIG. 1A. The probe is an idealized sphere of radius $r_{probe}$. Although it is impractical for a final device to be a round sphere, this model is used since its capacitance is simple to compute.

Connected to the sphere is an ideal charge sensor, which measures the charge that accumulates on the surface of the sphere. It is assumed that the voltage source and the sensor take infinitely small volume compared to the conducting sphere, therefore producing no electric field of its own. Furthermore, there is no voltage drop between the ideal charge sensor and the conducting sphere.

Assume at time $t \leq t_0$ the device previously being uncharged is now connected to the voltage source. At $t > t_0$ the device is connected to the voltage source. Calculating the accumulated charge on the sphere necessary to maintaining a voltage of $V_L$ leads to $Q=4\pi\epsilon_0 r_{probe} V_L$. This is the basic definition of the probe capacitance to ground, where $C=4\pi\epsilon_0 r_{probe}$. Using this, provides the relation $Q=CV_L$. If the value of C is know with certainty, for example by building a probe with a spherical shape of known radius placed in free space, then measuring the waveform of Q(t) gives the waveform for $V_L(t)$.

Regarding the ideal probe with a power line, the proximity of the capacitive probe to the charging power line, or any other charged conductor will decrease the effective capacitance of the sphere. Consider FIG. 1B. Using the same instrument as before, but now attached between the device and the ideal voltage source is a power line. The center of the conducting sphere is at a distance of $r_s$ from the center of the power line.

Assume a switch connecting the probe to the voltage source is switched on at some time $t_0$. At $t \leq t_0$ the cable is charged at $V_L$ but disconnected from the probe. Given that the line is at $V_L$ there is a non-zero electric potential at various points in the system, $V(r, \Phi, z)$.

Following the infinite length power line assumption, a rotational symmetry is assumed as well as uniformity along the cable and only V(r) is considered. Therefore at the moment $t > t_0$ only $Q=C(V_L-V(r_s))$ amount of electrons need to accumulate on the probe surface in order to bring the device to line voltage $V_L$. The voltage at surface of the sphere due to the accumulated charge is $V_L-V(r_s)$ while the contribution from the power line is $V(r_s)$ leading to both the power line and the device being charged to $V_L$. An effective capacitance $C_p$, $Q=V_L$ is defined, which holds regardless of power line proximity. Since $Q=C(V_L-V(rs))$, gives: $C_p=C(1-\alpha(r))$. Where $\alpha(r_s)=V_L$ is invariant to the actual voltage level and is computed from the system geometry.

Regarding an ideal probe with coupling interference source, coupled measurements between nearby conductors is an important effect that must be considered. In a capacitive line sensor, the predominant form of interference is from crosstalk between the various lines. Considered here is only a single interferer for now, but the results can be extended to multiple interfering power lines. FIG. 2A, shows the ideal body capacitor connected to the high voltage power line. This three-conductor system gives (1) the body capacitive probe $v_1$, (2) earth environment, which is grounded and (3) the interferer $v_2$. In a multi conductor system, a capacitance matrix describes the electrostatic geometry. Given the arrangement in FIG. 2A the full electrostatic environment is described by:

$$\begin{bmatrix} q_1 \\ q_2 \end{bmatrix} = \begin{bmatrix} c_{11}+c_{12} & -c_{12} \\ -c_{21} & c_{22}+c_{12} \end{bmatrix} \begin{bmatrix} v_1 \\ v_2 \end{bmatrix} \quad (1)$$

Here, considering only the charge accumulation on probe $q_1$ since $q_2$ is of no interest. Recall the effective capacitance $C_p$ is due to both the ground and the external environment. The cross term $c_{12}$ is the interference term $C_I$. Giving $$v_1(t) = (c_{11}+c_{12})v_L(t) - c_{12}v_2(t) \quad (2)$$

$$= C_p v_L(t) - C_I v_I(t). \quad (3)$$

Turning now to sensing methodology, presented here, the physical model is incorporated to develop a circuit representation of a passive LMCVT device. Then active calibration is introduced for implementation.

Regarding a circuit model of a body capacitive sensor, the circuit equivalent of the body capacitive probe with both proximity effect and interference is shown in FIG. 2B. The ideal charge sensor presented above, which measures the charge induced can be implemented in practice by an op-amp with feedback capacitor $C_s$.

Assume the line voltage is $v_L(t)=V_L \cos(\omega t+\Phi)$ the interference capacitance is ignored so $C_I=0$. The output of op-amp is calculated (and high end of the differential ADC), $V^+(j\omega)$. Since it is a non-inverting operational amplifier with feedback amplifier $Z_F$ and input impedance $Z_{IN}$ is $$V^+(j\omega) = \left(1 + \frac{Z_F}{Z_{IN}}\right) V_L(j\omega) \quad (4)$$

$$= \left(1 + \frac{C_p}{C_s}\right) V_L(j\omega). \quad (5)$$

Here it is assumed that the operational amplifier is ideal. In practice a low M Ω resistor is put in parallel with the capacitor to maintaining the leakage current of the device. The low end of the differential ADC is $V^-(j\omega)=V_L(j\omega)$. So the differential voltage measured at the input of the analog input is:

$$V(j\omega) = V^+(j\omega) - V^-(j\omega)$$

$$= \left(\frac{C_p}{C_s}\right) V_L(j\omega)$$

The addition of an interference source can be done via superposition principle. Shorting the AC voltage source and the body capacitor, leads to a negative feedback amplifier setup leading to the final form:

$$V(j\omega)^- = \frac{C_p}{C_s} V_L(j\omega) - \frac{\overline{C_I}}{C_s} V_I(j\omega)$$

or in time domain:

$$v(t) = \frac{C_p}{C_s} v_L(t) - \frac{C_I}{C_s} v_L(t) \quad (6)$$

For the operation of the device, the interference effects are neglected for two main reasons. (1) All low voltage experiments are performed in an enclosed environment. (2) In open environment experiments, the main signal terms $C_p V_L$ are much greater than the interference terms $C_I V_I$.

Regarding passively calibrated LMCVT, given this circuit model, a passive LMCVT merely samples the signal in (6). The digital signal v[n] is then used to estimate the probe capacitance and the line voltage.

The current invention provides actively calibrated LMCVT where one or multiple out of band pilot signals close to 60 Hz be inserted between the line voltage and the charge sensing stage. This can be performed with a general DSP platform, as in FIG. 3. In this situation, the device is at $v_L(t)$ voltage level, and the DAC output of pilot signal $v_P(t)$. In comparison to the passive device, the noninverting terminal voltage is $v^+(t)=v_L(t)+v_P(t)$ vs. $v^+(t)=v_L(t)$.

From (6), omitting the interfering power lines, we have that the input of a differential measurement is $$v(t) = \frac{C_p}{C_s}(v_L(t) + v_P(t)). \quad (7)$$

Since the line voltage and the pilot signal are at different frequencies, we can filter the received line voltage signal $(C_p/C_s)v_L(t)$, leaving only the term $(C_p/C_s)v_P(t)$. The pilot signal is a known quantity, therefore, it is possible to use the known signal to cover $C_p$. The practical implementation can be performed in an onboard DSP platform with details provided below. Active calibration eliminates the need of performing offline calibration for 'typical arrangements' of capacitive probes on transmission and distribution systems.

In theory, a small out of band pilot signal can estimate the probe capacitance at very high voltages. Consider a 300 KV high voltage line, and an injected pilot signal of 10 V. Given the typical body capacitance of $C_p$=20 pF, for the input to be scaled to ±5 V, then the feedback capacitor must be 600 nF. Also, in this situation, the amplitude of the pilot in the ADC is 167 µV. This may be lower than the noise floor, but since the geometry in high voltage lines changes so infrequently averaging periods can be rather large. In comparison, for a distribution line with nominal voltage of 10 kV, the minimum pilot voltage is 5 mV, which will be close to but higher than the noise floor.

For active calibration and line-mounted voltage sensing, according to the current invention, LMCVTs are the only line mounted measurement technique that lends itself to active calibration. To understand why, consider both the electrostatic field technique and capacitive coupling method shown in FIG. 4.

Figure 4:
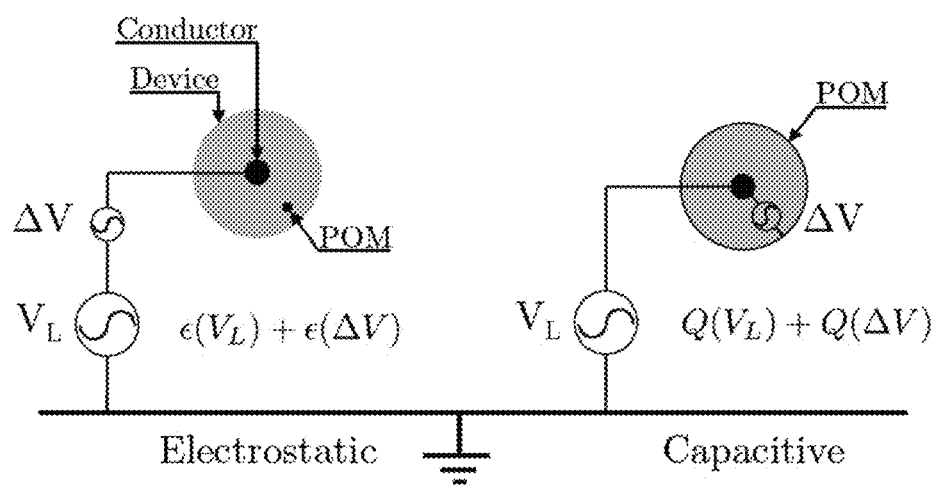
FIG. 4 shows a comparison of 'active calibration' mechanism in electrostatic field measurements and capacitively coupled measurements. Both methods include a line voltage source $V_L$, perturbation voltage_V, device enclosure, point of measurement (P.O.M.), and contact conductor, according to one embodiment of the invention.

In the case of electrostatic field measurement, the Point of Measurement (P.O.M) is a point inside the device. The measured value $E=\epsilon(V_L)$ depends on the physical configuration of the conductor and the remaining environment. Normally, some offline procedure is used to calibrate an inverse mapping $\hat{V}=\epsilon^{-1}(E)$, where $\epsilon^{-1}(\bullet)$ is fixed. An active calibration must have a voltage perturbation on the entire conductor, to measure a perturbed output $\epsilon(\Delta V)$ since the field depends on the changed conductor interacting with the environment. In FIG. 4 (left), the perturbation voltage must be placed on the entire conductor.

Alternatively, for capacitive coupling, the measured $Q(V_L)$ depends on physical configuration of the capacitive material and the remaining environment. In this case, active calibration needs to only to inject a voltage perturbation onto the conductive material to measure a perturbed output $Q(\Delta V)$ since the accumulated charge is caused by the conductive materials interaction with the environment. This arrangement is feasible in a practical line mounted circuit. In FIG. 4 (right), the perturbation voltage can be placed between the conductor and the floating capacitor.

For an active calibration algorithm, according to one embodiment, a high level architecture view of the tasks required for active calibration. Then we provide detailed descriptions of each task block.

Figure 5A:
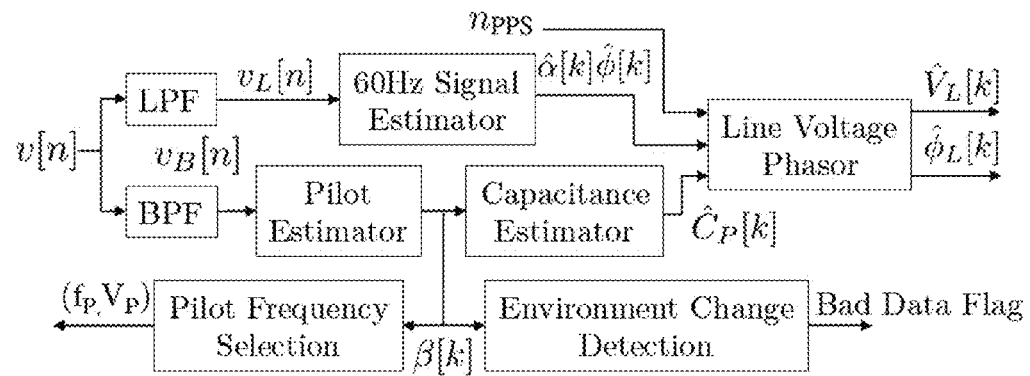
FIGS. 5A-5B show (5A) data flow for the LMCVT device for enabling PMU functionality. Sampled data v[n] is filtered: (1) with low pass filter (LPF) for line voltage phasor estimation (2) band pass filtered (BPF) for each pilot signal. Variations on NLLS sinusoid estimator are used in extracting recovered pilot magnitude $\beta_1[k] \ldots \beta_M[k]$ and mains sinusoid phasor $\alpha[k]$, $\phi[k]$. The pilot signals are used to (1) estimate the probe capacitance $\hat{C}_p[k]$ (2) invalidate signal output via bad data flag via environmental change point detection. Finally, the two are used for outputting the final voltage phasor. If recovered pilot frequencies are determined to exist on occupied line frequency, frequency selection can take place, and (5B) an exemplary capacitive probe having a conductive cylinder disposed about a power line, according to one embodiment of the invention.

FIG. 5A shows one embodiment of a general signal processing workflow for extracting the line voltage from the received v[n] that includes:

1. Line and Pilot Signal Estimation: This step estimates $\alpha[k]$; $\Phi[k]$ the line magnitude/phase and $\beta_1[k] \ldots \beta_M[k]$, the pilot magnitude in a single cycle basis. Signal $\alpha[k]$ is used to recover line voltage, and $\beta_1[k] \ldots \beta_M[k]$ is used to recover the probe capacitance.
2. Frequency Selector: Certain frequency bands can be periodically corrupted by interfering line sources. To ensure clear frequency access, the recovered signal must be deemed reliable, if not a reliable pilot frequency must be determined. This block controls the M pilot frequencies and magnitudes: $f_{p,m}$, $V_{p,m}$.
3. Probe Capacitance Estimator: Signals $\beta_1[k] \ldots \beta_M[k]$ are used to reconstruct the probe to ground capacitance $C_p$. Ideally environmental changes are infrequency (on order of minutes or hours) so very accurate estimates can be made.
4. Environmental Change Detector: The recovered pilot signal $\beta[k]$ is used to detect changes to the environment so that a portion of the system output is discarded. After disturbances, the previous estimate data are discarded. In the following sections each of the subcomponents are presented.

For the sinusoid estimation, a NLLS Estimation procedure is applied to both $v_L[n]$ and $v_B[n]$. A standard least squares signal estimator is applied for the signal amplitude and phase. For completeness, the exact methodology is presented here. The method is applied on a vector of length N, which is set by the sample rate and expected device output rate. The nominal device output rate is $f_{frame}$=60 S/s, which corresponds to a single cycle frame length. The general least squares estimation problem is $$\hat{\theta}, \hat{\omega} = \underset{\theta,\omega}{\operatorname{argmin}} \sum_{n}^{N} (f_{\theta,\omega}[n] - v[n])^2. \quad (8)$$

Given the sampled waveform v[n] and the fitting function $f_{\theta,\omega}[n]$. The fit function, $f_{\theta,\omega}[n]$, is a sum of L sinusoids of various unknown frequency ($\omega$) and amplitude/phase ($\theta$), given by $$f_{\theta,\omega}[n] = \sum_{l=1}^{L} \alpha_l \sin(\omega_l n + \phi_l).$$

Here, it is assumed that the number of sinusoids can be determined from prior knowledge or pre-processing step (FFT analysis). To determine the sinusoid parameters the problem is split into two separate subproblems: (1) $\omega$ known/$\theta$ unknown (2) $\omega$, $\theta$ unknown. Both can be solved by the same computational steps, if it is assumed that $\omega$ is known, $\dot{\theta}$ can be calculated by the following least square analysis. Note the fit function can be rewritten as $$f_{\theta,\omega}[n] = \sum_{l=1}^{L} \underbrace{\alpha_l \cos(\phi_l)\sin(\omega_l n)}_{\gamma_l} + \underbrace{\alpha_k \sin(\phi_l)\sin(\omega_l n)}_{\eta_l}$$

where $\theta = [\gamma_1, \eta_1, \ldots, \gamma_L, \eta_L]^T$ is unknown. The inference problem in (8) is non-linear in $\alpha_k$ and $\phi_k$, but linear in $\gamma_k, \eta_k$, where $\gamma_k = \alpha_k \cos(\phi_k)$ and $\eta_k = \alpha_k \sin(\phi_k)$. $F(\omega, \theta) = [f_{\theta,\omega}[0], \ldots, f_{\theta,\omega}[N]]^T$, which is equivalent to $F(\omega,\theta) = M(\omega)\theta$. Where $$M(\omega) = \begin{bmatrix} \cos(\omega_1 0) & \sin(\omega_1 0) & \ldots & \cos(\omega_M 0) & \sin(\omega_L 0) \\ \vdots & \vdots & & \vdots & \vdots \\ \cos(\omega_1 N) & \sin(\omega_1 N) & \ldots & \cos(\omega_M N) & \sin(\omega_L N) \end{bmatrix}$$

and define $v = [v[0], \ldots, v[N]]^T$. Assuming fixed frequency, the amplitude/phase component can be solved via linear least squares analysis:

$$\hat{\theta}(\omega) = \underset{\theta}{\arg\min} \| v - M(\omega)\theta \|.$$

The least square solution is the following: $\dot{\theta}(\omega) = (M(\omega)^T M(\omega))^{-1} M(\omega)^T v$. Finally given the $\gamma_k, \eta_k$ values, the sinusoid amplitude and phase are computed by:

$$\alpha[k] = \sqrt{\gamma^2 + \eta^2} \quad (9)$$

$$\phi[k] = \tan^{-1}(\gamma/\eta). \quad (10)$$

In the case of tracking the line frequency, since the line magnitude is orders of magnitude larger than any harmonics, only using the low pass filter v[n] and tracking a single sinusoid M=1 is needed. In the case of the pilot signal, multiple harmonics are tracked to improve pilot tracking accuracy. Note that the pilot magnitude, v[k] is estimated identically as $\alpha[k]$, using (9).

This formulation allows for one to separate the estimation of the multiple sinusoid parameters from the estimation of the frequency of the line/pilot/harmonics. Since the minimization in (8) depends on fixed pilot/harmonic frequencies $\omega$, a second outer\minimization can be performed to track each frequency. A number of techniques to quickly estimate the frequency of various harmonics are found in literature. This level of computation is required for tracking the pilot signal when it is surrounded by multiple harmonics. This has practical reason also due to ADC clock drift: actively tracking frequency improves the estimate output.

For capacitance estimation, assuming non-interfering pilot frequency, and no environmental changes, it is assumed that for a moderate timescale (minutes-hours), the capacitance of the system is fixed. Depending on whether single or multiple frequencies are used in the estimation, different estimation procedures are employed. Here focus is directed only on a single pilot mechanism.

Assume a constant $C_P = \overline{C}_P$ over a short time horizon. In single pilot mode, the injected pilot signal is $v_P(t) = V_P \cos(2\pi f_1 t + \phi_1)$. From (6), the recovered signal can be represented with the following linear equation:

$$\beta[k] = \frac{V_P}{C_s} \overline{C}_P + w[k] \quad (11)$$

for processing interval $k = \{1, \ldots, K\}$. Here, w[k] is additive noise with noise bandwidth coming from the bandpass filter in FIG. 5A. Over a long timeframe, where the probe capacitance is assumed fixed, and no environmental changes are detected.

The least square estimate of the probe capacitance is then:

$$\hat{C}_P = \frac{C_s}{V_P}\left(\frac{1}{K}\sum_{0}^{K}\beta[k]\right). \quad (12)$$

Turning now to line voltage estimation, the estimate of the probe capacitance, $\hat{C}_P[k]$, estimating the line voltage can be calculated from:

$$\hat{V}_L[k] = \frac{C_s}{C_P[k]} \alpha[k]. \quad (13)$$

Figure 8A:
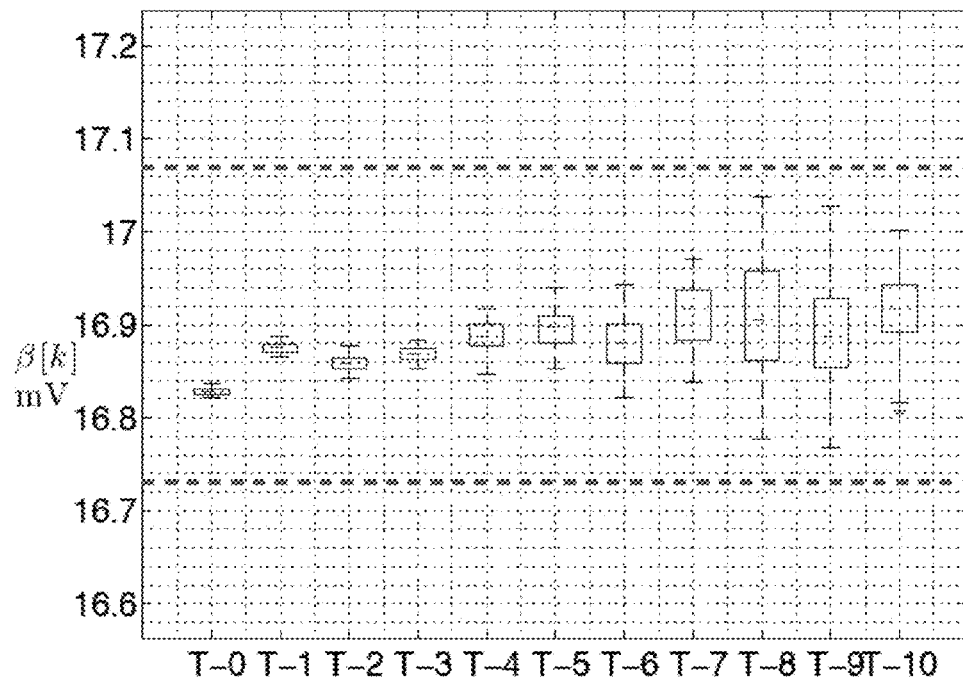
FIGS. 8A-8B show recovered pilot magnitude $\beta[k]$ for K=60 samples/second output rate. Note that pilot signal is fairly stable over the range of line voltages under each test. (8B) Mean pilot amplitude under each test scenario is used to estimate the probe capacitance, according to one embodiment of the invention.

Assuming that $\hat{C}_p[k] = \hat{C}_p, \forall k$. The estimation interval of $\alpha[k]$ is set by the measurement output rate of the device. A voltage estimation experiment is performed to validate the usefulness of the active calibration procedure in a fixed environment. The probe capacitance is calculated based on the $\beta[k]$ time series in FIG. 8A using (12). The output period is 1/60 seconds, or single cycle estimate.

Figure 5B:
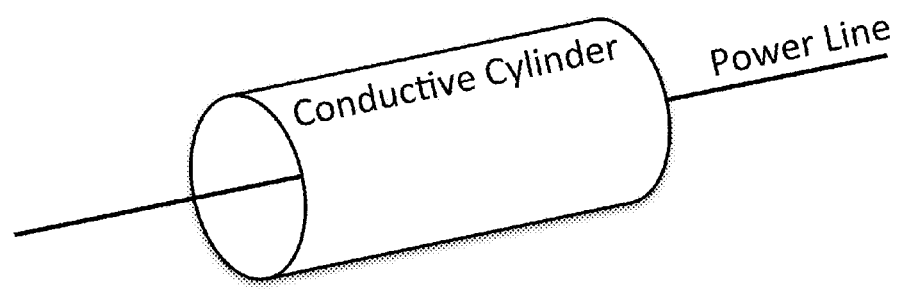

FIG. 5B shows an exemplary capacitive probe having a conductive cylinder disposed about a power line.

In an exemplary experiment setup, the wall outlet voltage is connected to a variable transformer (variac) then to a step up transformer so that various test voltages can be generated. The maximum achievable voltage under this technique is 1.28 kV. This signal has a significant amount harmonic distortion. However, achieving high accuracy under this condition lends confidence of the pilot mechanism working in an actual distribution and transmission lines where out of band noise is common.

Presented below are tests at various voltages, indicated as $\{T_0, T_1, \ldots, T_9, T_{10}\}$ correspond to variac positions of $\{0\%, 10, \ldots 90\%, 100\%\}$ of the maximum voltage output. The multimeter ground truth values are $V_{L,t}$, for $t = \{0, \ldots, 10\}$, and given in Table I.

TABLE I

Voltage Estimation Experiments

| | Ĉ_p estimation via pilot | | C_p* full scale estimate | |
|---|---|---|---|---|
| $V_L$ | $\hat{V}_L$: mean/(range) [V] | error: mean/sd/(range) [%] | $\hat{V}_L$: mean/(range) [V] | error: mean/sd/(range) [%] |
| 125.2 | 122.5/(122.0 122.7) | 2.19/0.0638/(2.0 2.5) | 123 (122 123) | 1.61/1.6182/(1.45 1.99) |
| 250.5 | 250.1/(249.6 250.5) | 0.19/0.0749/(0.03 0.37) | 251 (250 251) | −0.30/0.3148/(−0.46 −0.12) |
| 383.6 | 384.0/(383.3 384.3) | 0.19/0.0483/(0.03 0.37) | 386 (385 386) | −0.72/0.7262/(−0.80 −0.53) |
| 499.2 | 502.6/(501.7 503.1) | 0.68/0.0467/(−0.07 0.49) | 506 (505 506) | −1.39/1.3920/(−1.48 −1.20) |
| 631.4 | 629.3/(626.9 629.8) | 0.68/0.0457/(−0.07 0.49) | 634 (631 634) | −0.40/0.4108/(−0.49 −0.03) |
| 763.6 | 752.8/(749.9 753.3) | 1.42/0.0406/(1.35 1.79) | 758 (755 758) | 0.73/0.7335/(0.65 1.10) |
| 890.9 | 881.0/(879.6 882.1) | 1.11/0.0533/(0.99 1.27) | 888 (886 889) | 0.30/0.3113/(0.18 0.46) |
| 1019.6 | 1011.5/(1006.8 1013.0) | 0.80/0.0716/(0.64 1.25) | 1020 (1015 1021) | −0.06/0.0996/(−0.22 0.38) |
| 1146.9 | 1136.3/(1130.8 1144.6) | 0.92/0.0742/(0.2 1.39) | 1145 (1140 1154) | 0.10/0.1251/(−0.62 0.58) |
| 1281.2 | 1270.1/(1266.5 1272.1) | 0.87/0.0696/(0.71 1.14) | 1282 (1278 1284) | −0.07/0.1018/(−0.23 0.20) |
| | | 0.71/0.0589/(0.52 1.01) | | −0.02/0.0593/(−0.20 0.28) |

Figure 6A:
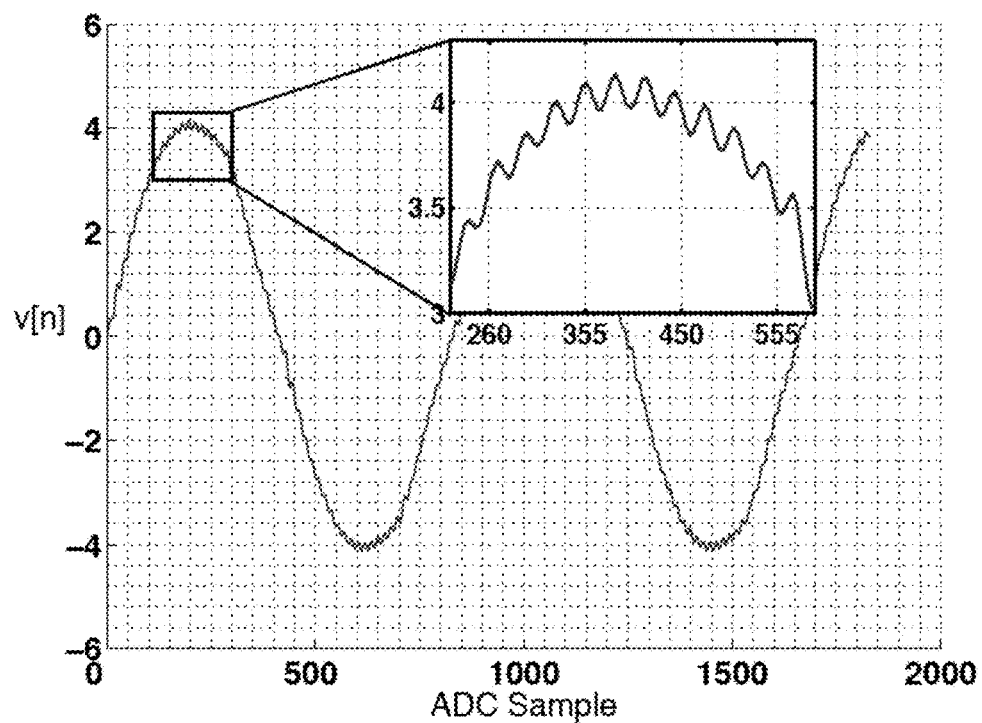
FIGS. 6A-6B shows (6A) shows a typical captured time series from the LMCVT system. (6B) shows the frequency region around the 3.2 kHz pilot signal recovered on v(t). Note prevalence of multiple harmonics of the main 60 Hz signal at amplitudes close to the pilot amplitude, according to one embodiment of the invention.
Figure 6B:
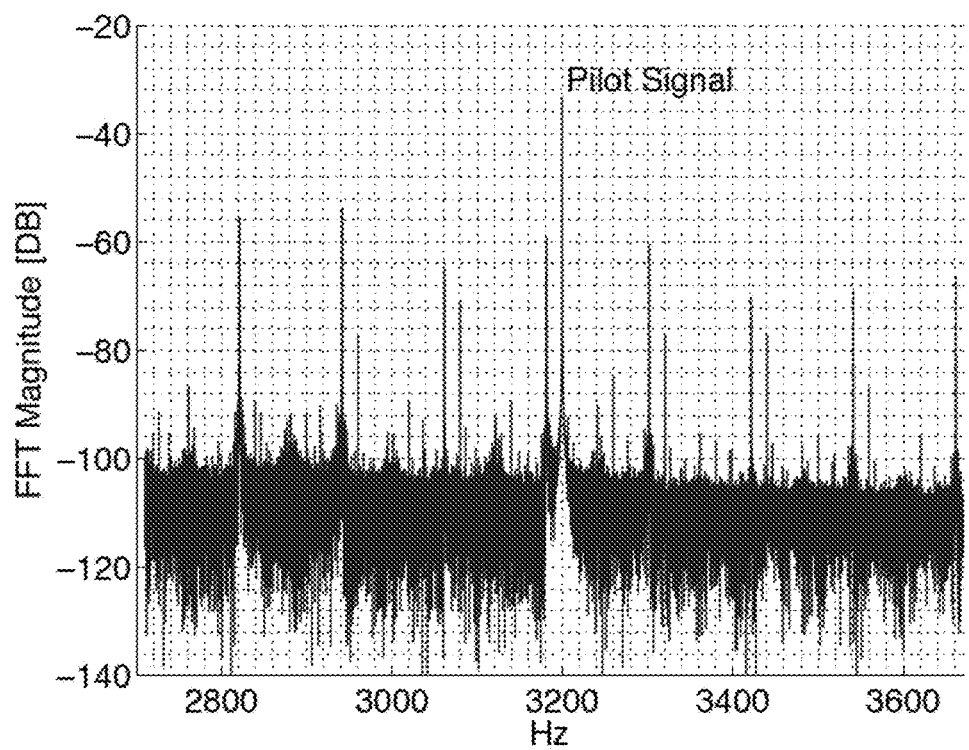

FIGS. 6A-6B, show the typical voltage waveform v[n] in sample and frequency domain. It is clear that the injected pilot signal is observed in v[n], as shown in FIG. 6A. However, looking in the frequency domain, FIG. 6B, the signal is shown to be closed in magnitude as the various harmonics of the mains voltage. These harmonics can be caused by (1) harmonic distortion from the ADC (2) harmonics of the 60 Hz signal that is normally present in the system. FIG. 6 indicates that care must be taken in extracting the pilot amplitude.

Figure 7A:
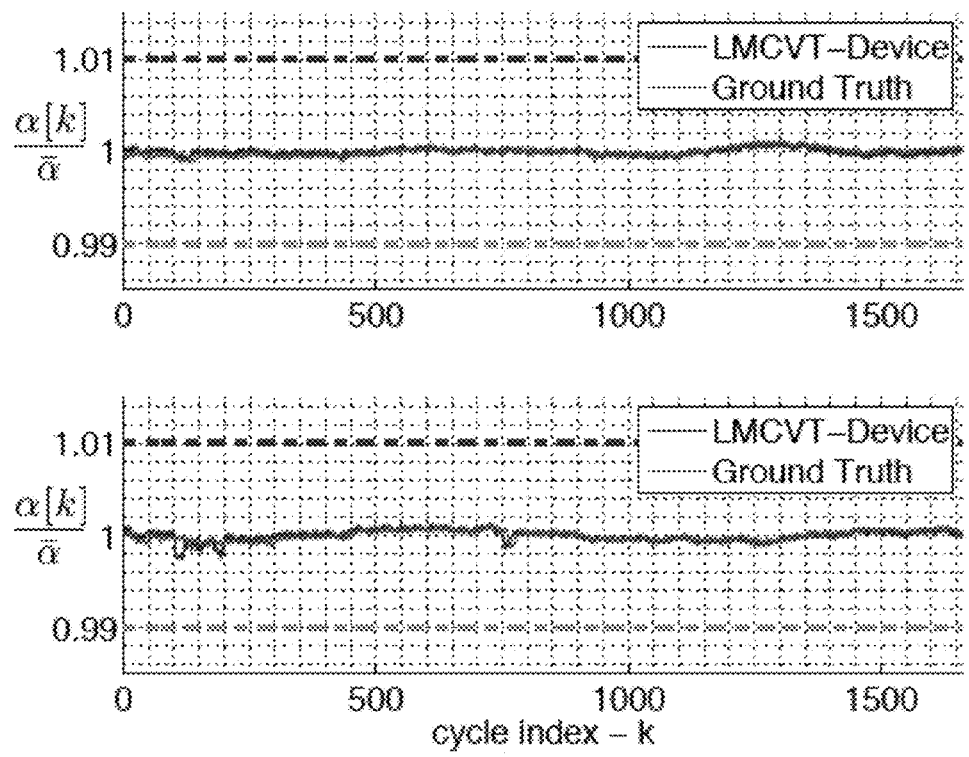
FIGS. 7A-7B shows (7A) Normalized value of $\alpha_k$ for the LMCVT device and COTS resistor divider ground truth in restricted faraday cage setup (top subplot) and open air experiment (bottom subplot). Time series show stability in the estimated signal amplitude. (7B) Box plot for test $T_7, \ldots, T_{10}$. For each test, single cycle amplitudes shown in controlled, faraday cage (left) and outside, free floating (right) environment, according to one embodiment of the invention.
Figure 7B:
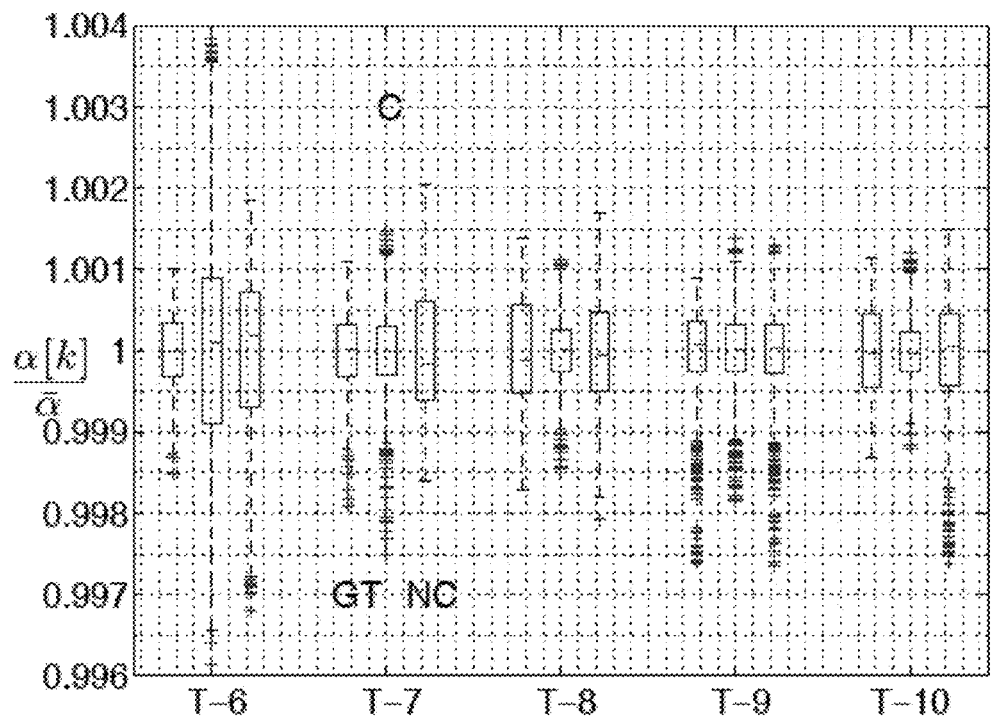

For the line and pilot signal estimation, the captured waveform v[n] is low pass filtered to remove any high frequency components. The NLLS procedure is applied on $v_L[n]$ under various test voltages. FIG. 7A shows the recovered amplitude time series in a single cycle capture window. FIG. 7B shows box plots of the ground truth (GT), controlled (C) and free space (NC) relative voltage magnitude captures. The experiments indicate that the received voltage magnitude are comparable in variation. This is very important since it indicated that under nominal conditions of fixed $C_p$, the variation between a traditional grounded instrument (GT), fixed floating capacitor (C), and open air float in capacitor (NC) are nearly identical. The largest source of error is the estimation error of the probe capacitance, and not the variation of the line signal. This makes sense since, the maximum variation of the line voltage α[k] is well within the ±1% limits for full capture variation.

Figure 8B:
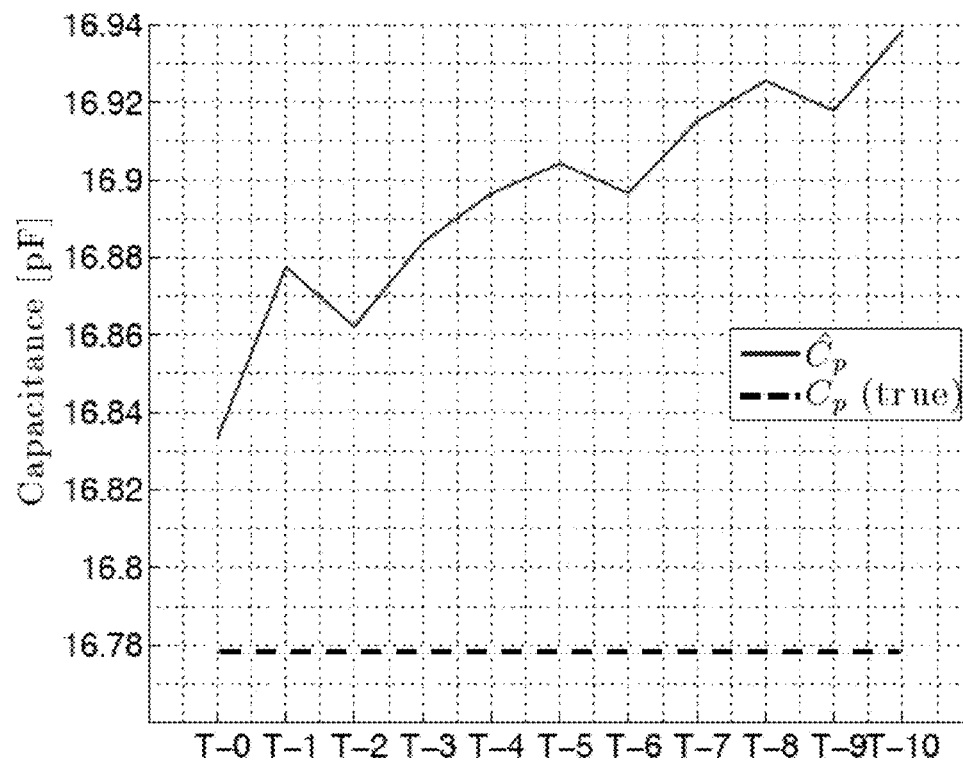

For the capacitance estimation, FIG. 8B shows the estimate of $\hat{C}_P$ (solid line) under each experiment. Although the signals look very close to each other, for a long time capture, an upward bias is evident. A full scale estimate of the probe capacitance, $C_p*$, is shown as well (dashed line). This is estimated as from the experimental data by solving the following regression:

$$\bar{\alpha}_t = \gamma V_{L,t} + e_t, \quad (14)$$

$$C_p* = C_s \hat{\gamma} \quad (15)$$

Here, $V_{L,t}$ is the mean voltage recorded on the digital multimeter ground truth.

The estimation error of a single capacitance estimate is the following:

$$\sigma(\hat{C}_p) = \left(\frac{C_s}{V_P}\right)\sigma_W.$$

For the 1.2 kV test environment, it is that $C_s$=10 nF and $V_P$=10V, however additive variance is extremely small. To see why, the total additive noise on the signal is 2 mV, typically, $$\frac{\sigma(\hat{C}_P)}{C_P} \approx 3.8 \times 10^{-4}.$$

So, the variation of the single cycle case, under moderate averaging intervals is fairly low. A more important source of error is bias in the estimate, which leads to most of the error. It is clear that the change point problem has been separated out as well as the capacitance tracking problem.

The line voltage estimation results in TABLE I show the performance attained in the example experiment, where the signal generated in Column 1 indicates the ground truth voltage, which is what is indicated in the digital multimeter applied to the line signal. Columns 2, 3 indicate the results of the pilot based estimation. The output of the device is a single cycle estimate of the line voltage $V_L[k]$. From this the single cycle relative errors are calculated:

$$e[k] = \frac{V_L - V_L[k]}{V_L}$$

for each test. Therefore, \the following terms are reported on a single cycle basis:

1. error mean $\mu(e) = \frac{1}{K}\Sigma_k e[k]$, 2. standard deviation $\sigma(e) = \sqrt{\frac{1}{K}\Sigma_k (e[k] - \mu(e))^2}$ 3. range: $r(e) = (\min_k e[k], \max_k e[k])$ The results indicate that the current prototype is unable to reach PMU accuracy, since the maximum voltage error exceeds the 1% total vector error for single cycle estimates. The mean relative error over all the tests is 0.72%, this is because of the overall overestimate of the probe capacitance in each test as shown in FIG. 8B indicating a positive bias. However, this may be removed by a multi-frequency pilot mechanism or higher frequency pilots where there is less harmonic distortion on the signal.

Column 3, 4 indicates the voltage estimation results when the full scale capacitance is known. Clearly the mean bias over all tests is reduced so that is it near 0%. In the experiments however, it is difficult to calibrate one device over another due to lack of high resolution multimeters. Both digital multimeter and the LMCVT may very well have offsets on the order of 1%. This however, does not take away from the fact that in both cases, the maximum variation over all tests is quite small. In both cases, the mean relative error is less than 1% in the higher voltage cases, where the effect of external interferers is minimal. The results under estimated probe capacitance and true capacitance highlight the need for improved signal design and signal processing algorithms in future work.

Figure 9A:
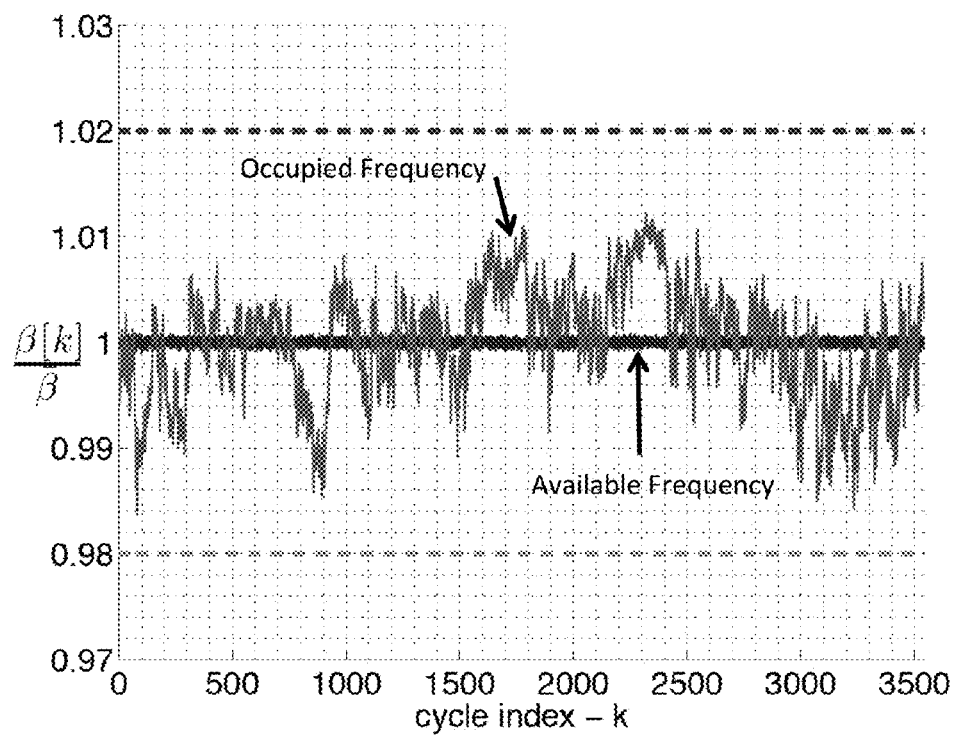
FIGS. 9A-9B show experiment showing two frequencies used for pilot magnitude estimation: $f_1=3.2$ kHz and $f_2=5$ kHz. Pilot $f_1$ sees an interference signal, while $f_2$ does not. The result is clear difference in the variation of each pilot amplitude: the clear frequency sees additive low variance white noise, while the occupied frequency experiences high variance autoregressive process, according to one embodiment of the invention.

For the pilot frequency selector, since the line magnitude can be orders of magnitude larger than the injected pilot signal, the presence of harmonics or spurious signal a the exact pilot frequency can be a source of error. Care must be taken in deciding what frequency is chosen. An example experiment where to non-harmonic pilot frequencies were chosen, 3.2 kHz and 5 kHz. In this case, the 3.2 kHz frequency contained energy while the 5 kHz frequency had none. The two are referred to as available and occupied pilot frequencies. In the reconstruction of the pilot frequency, there is a very clear difference between the two signals shown in FIG. 9A. In the experiment the least square estimate in (8), is solved every 1/60 seconds. Using a sample rate of 55 kHz, this leads to ~917 samples for estimation, leading to high accuracy in the NLLS procedure.

Observing the two situations indicate a clear difference in each signal type. A clear channel frequency leads to constant receive pilot amplitude, assuming that the environment is fixed. In this case, the error is of very low variance, uncorrelated and gaussian. On the other hand, when the pilot frequency is occupied, the received amplitude is highly correlated with a variance an order of magnitude larger than in the clear channel case. There is likely to be confusion between interfering signals at a chosen pilot, and actual environmental changes that can cause the true value of $C_P(t)$. However, since $C_P(t)$ affects all frequencies this can be avoided by use of multiple pilot signals.

Figure 9B:
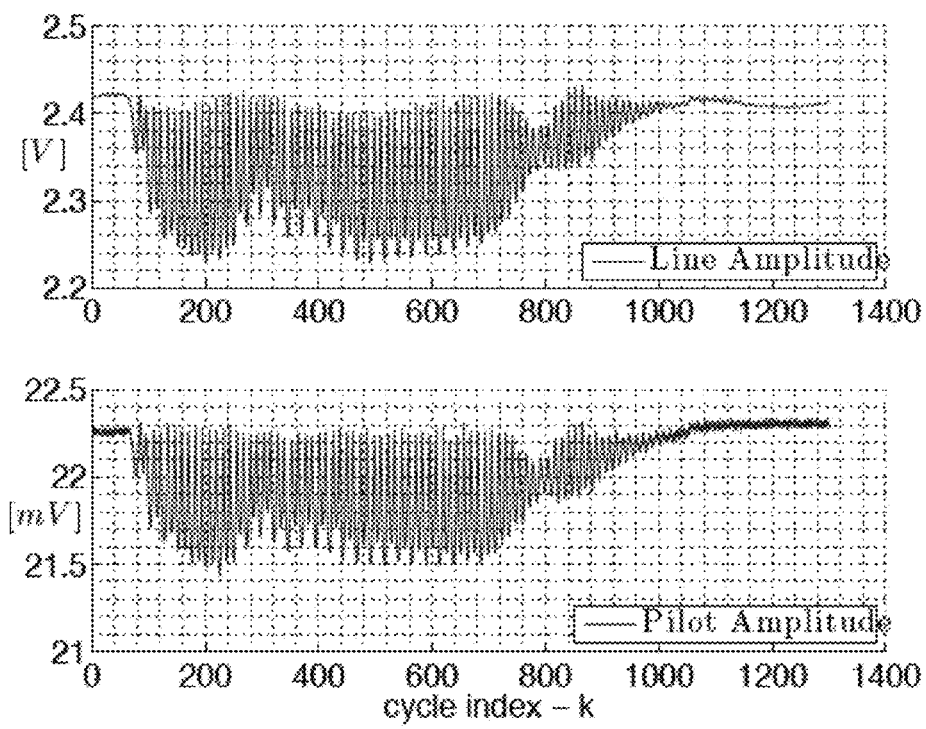

For the capacitance change detection, if it is assumed that the pilot frequency is clear of any interference sources, $\beta[k]$ can be used to detect changes in the environment. At low enough signal frequencies, it is assumed all frequencies will see the same $C_P(t)$, so any environmental disturbance affecting the 60 Hz line, can be distinguished from actual voltage changes since it will be seen on a clear pilot frequency. An experiment illustrating this was performed, where a metallic pendulum was built and used to bring a grounded surface repeatedly close to the shell of the device, as what would happen in some fast changing environmental change on the line. A line voltage of 1.2 kV was applied on the main line, with a pilot signal of 10 V at 5 kHz. Again, a 1/60 second capture window was chosen for processing. Although this can be varied, it's implausible that changes in the physical environment will occur at a very high rate. FIG. 9B shows clearly that disturbances on both the 60 Hz line and 5 kHz pilot signal can be detected due to the sensitivity of the pilot signal. The frequency of the pendulum given by $$\frac{1}{2\pi}\sqrt{\frac{g}{l}} \approx 1.3 \text{ Hz}$$

matches closely to the frequency of detected oscillation. The output of the detector will be a bad data quality flag indicating accuracy compromise of the system. Since environmental disturbances do no constantly occur on a stable transmission lines, the impact of measurement continuity is likely to be minor. The variance of the pilot estimate in a fixed environment will be crucial to the performance of any change point detector. A tradeoff in computational resources dedicated to more refined pilot tracking exists; for example, (1) tracking and removing various harmonics, (2) adaptively tracking and estimating their frequencies (3) length and bandwidth of bandpass filters.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A method of estimating a line voltage, comprising:
   a) configuring a capacitive probe to a power line;
   b) injecting, using an actively calibrated line mounted voltage capacitive transducer (LMCVT), a perturbation voltage onto said capacitive probe, wherein said actively calibrated LMCVT comprises a charge sensor circuit, a digital signal processor (DSP), and an amplifier, wherein a pilot signal is generated in said DSP, wherein said pilot signal is amplified by said amplifier, wherein said amplified pilot signal is input to a first input of a differential analog to digital converter (ADC) connected to a digital signal processor (DSP), wherein said amplified pilot signal is simultaneous received by said differential ADC and input to said charge sensor, wherein said charge sensor outputs a capacitive probe pilot signal according to a capacitance value of said probe, wherein said capacitive probe pilot signal is input to a second input to said differential ADC, wherein said amplified pilot signal and said charge probe pilot signal are compared by said DSP to determine an amplitude of said modified pilot signal, wherein said modified pilot signal amplitude is compared to a capacitance of said charge sensor circuit and an amplitude of said amplified pilot signal to estimate a probe capacitance; and
   e) using said estimated probe capacitance to determine a line voltage.

2. The method according to claim 1, wherein said capacitive probe comprises a conductive cylinder disposed about said power line.

3. The method according to claim 1, wherein said capacitive sensor comprises a charge measuring circuit and a digital signal processor.

4. The method according to claim 3, wherein said digital signal processor is configured to filter sampled data using a low pass filter for providing a line voltage phasor estimation, wherein said digital signal processor is configured to filter said perturbation signal using a band pass filter, wherein said perturbation signal is used to estimate said probe capacitance, wherein said perturbation signal is used to invalidate unwanted data output resulting from environmental changes.

* * * * *